(12) United States Patent
Park et al.

(10) Patent No.: US 12,200,960 B2
(45) Date of Patent: Jan. 14, 2025

(54) DISPLAY APPARATUS AND METHOD OF MANUFACTURING THE SAME

(71) Applicant: SAMSUNG DISPLAY CO., LTD., Yongin-si (KR)

(72) Inventors: Young Ok Park, Hwaseong-si (KR); Byung Hoon Kang, Hwaseong-si (KR); Seung Kim, Seongnam-si (KR); Su Jin Sung, Hwaseong-si (KR); Gyu In Shim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/054,135

(22) Filed: Nov. 9, 2022

(65) Prior Publication Data
US 2023/0089913 A1 Mar. 23, 2023

Related U.S. Application Data

(62) Division of application No. 16/922,663, filed on Jul. 7, 2020, now abandoned.

(30) Foreign Application Priority Data

Oct. 11, 2019 (KR) .......................... 10-2019-0126435

(51) Int. Cl.
H10K 50/844 (2023.01)
H10K 59/12 (2023.01)
H10K 59/124 (2023.01)
H10K 59/131 (2023.01)
(Continued)

(52) U.S. Cl.
CPC .......... *H10K 50/844* (2023.02); *H10K 59/124* (2023.02); *H10K 59/131* (2023.02); *H10K 71/00* (2023.02); H10K 59/1201 (2023.02); H10K 2102/00 (2023.02)

(58) Field of Classification Search
CPC .. H10K 50/844; H10K 59/131; H10K 59/124; H10K 59/1201; H10K 71/00; H10K 2102/00
See application file for complete search history.

(56) References Cited

U.S. PATENT DOCUMENTS

2003/0143491 A1* 7/2003 Lu .......................... G03F 7/3092
430/315
2003/0201447 A1 10/2003 Yamazaki et al.
(Continued)

FOREIGN PATENT DOCUMENTS

JP 2016211040 A * 12/2016 ........... H01L 21/286
KR 10-0899426 5/2009
(Continued)

Primary Examiner — Shaun M Campbell
(74) Attorney, Agent, or Firm — F. CHAU & ASSOCIATES, LLC

(57) ABSTRACT

A display apparatus includes a base substrate, a first organic insulating layer disposed on the base substrate, and a second conductive pattern disposed on the first organic insulating layer. The conductive pattern includes a first layer that includes a first metal and that has a first thickness. A diffusion layer that makes contact with the first layer and that includes an oxide of the first metal and has a second thickness less than the first thickness is formed at an uppermost portion of the first organic insulating layer.

12 Claims, 19 Drawing Sheets

(51) Int. Cl.
*H10K 71/00* (2023.01)
*H10K 102/00* (2023.01)

(56) References Cited

U.S. PATENT DOCUMENTS

| | | | |
|---|---|---|---|
| 2005/0007015 A1* | 1/2005 | Yokoyama | H10K 50/824 |
| | | | 313/506 |
| 2009/0075438 A1* | 3/2009 | Jo | H10K 59/124 |
| | | | 257/E21.219 |
| 2011/0318602 A1 | 12/2011 | Yoshida | |
| 2017/0155080 A1 | 6/2017 | Jo et al. | |
| 2017/0345883 A1 | 11/2017 | Song et al. | |
| 2018/0192512 A1* | 7/2018 | Song | H01L 27/124 |
| 2018/0212198 A1* | 7/2018 | Inoue | H10K 59/80521 |
| 2021/0111372 A1 | 4/2021 | Park et al. | |

FOREIGN PATENT DOCUMENTS

| | | |
|---|---|---|
| KR | 10-2015-0006946 | 1/2015 |
| KR | 10-2018-0133007 | 12/2018 |

\* cited by examiner

DISPLAY APPARATUS AND METHOD OF MANUFACTURING THE SAME

CROSS-REFERENCE TO RELATED APPLICATION

This application is a divisional of U.S. patent application Ser. No. 16/922,663, filed on Jul. 7, 2020 in the U.S. Patent and Trademark Office, which claims priority under 35 USC § 119 from, and the benefit of, Korean Patent Application No. 10-2019-0126435, filed on Oct. 11, 2019 in the Korean Intellectual Property Office (KIPO), the contents of both of which are herein incorporated by reference in their entireties.

BACKGROUND

1. Technical Field

Exemplary embodiments are directed to a display apparatus and a method of manufacturing the display apparatus. More particularly, embodiments of the present inventive concept are directed to a display apparatus that has an improved display quality and a method of manufacturing the display apparatus.

2. Discussion of the Related Art

Recently, as technology improves, display products that are smaller, lighter in weight, and have superior performance have been produced. Conventional cathode ray tube (CRT) televisions have been widely used for display apparatuses with many advantages in terms of performance and price. Recently, however, a display apparatus such as a plasma display apparatus, a liquid crystal display apparatus, or an organic light emitting diode display apparatus, which and have advantages over CRTs such as miniaturization, light weight, and low power consumption, has been spotlighted.

A display apparatus includes a plurality of conductive layers and a plurality of insulating layers, and a difference in display quality of a display apparatus reflects respective process conditions, etc. Accordingly, there have been various efforts to form better quality conductive layers and insulating layers.

SUMMARY

Some exemplary embodiments provide a display apparatus that have improved display quality, which prevent defects from being generated in the conductive patterns disposed on an organic insulating layer.

Some exemplary embodiments provide a method of manufacturing the display apparatus.

According to an exemplary embodiment, a display apparatus includes a base substrate, a first organic insulating layer disposed on the base substrate, and a second conductive pattern disposed on the first organic insulating layer. The second conductive pattern includes a first layer that includes a first metal and that has a first thickness. A diffusion layer that makes contact with the first layer and that includes an oxide of the first metal and that has a second thickness smaller than the first thickness is formed at an uppermost portion of the first organic insulating layer.

In exemplary embodiments, the second thickness is equal to or less than 40% that of the first thickness.

In exemplary embodiments, the first metal includes titanium, the diffusion layer includes titanium, oxygen, and fluorine, and the first organic insulating layer includes a polyimide-based resin.

In exemplary embodiments, the first thickness is from 41 nm to 45 nm, and the second thickness is 15 nm or less.

In exemplary embodiments, the second conductive pattern includes the first layer, a second layer disposed on the first layer, and a third layer disposed on the second layer. The first and third layers include titanium, and the second layer includes aluminum.

In exemplary embodiments, the display apparatus further includes a first conductive pattern disposed between the base substrate and the first organic insulating layer. The first conductive pattern and the second conductive pattern at least partially overlap each other.

In exemplary embodiments, the first conductive pattern includes a first data line, and the second conductive pattern includes a second data line that at least partially overlaps the first data line.

In exemplary embodiments, the display apparatus further includes a thin film transistor disposed on the base substrate, an insulating layer disposed between the first organic insulating layer and the base substrate and that covers the thin film transistor, a second organic insulating layer disposed on the second conductive pattern, and a light emitting structure disposed on the second organic insulating layer.

According to an exemplary embodiment, a method of manufacturing a display apparatus include forming a first organic insulating layer on a base substrate, heating a top surface of the first organic insulating layer, forming a conductive layer that includes a first layer that has a first thickness and that includes a first metal on the first organic insulating layer, and forming a second conductive pattern by patterning the conductive layer. A diffusion layer that makes contact with the first layer that includes an oxide of the first metal and that has a second thickness that is less than the first thickness is formed at an uppermost portion of the first organic insulating layer.

In exemplary embodiments, the first layer is formed by a sputtering scheme when the conductive layer is formed.

In exemplary embodiments, the method further includes cleaning the top surface of the first organic insulating layer by using a cleaning fluid before heating the top surface of the first organic insulating layer.

In exemplary embodiments, heating the top surface of the first organic insulating layer includes heat-treating the top surface at a temperature between 60 degrees and 150 degrees for a time of at least 16 seconds.

In exemplary embodiments, the method may further include forming a first conductive pattern on the base substrate before forming the first organic insulating layer. Here, the first conductive pattern and the second conductive pattern at least partially overlap each other.

In exemplary embodiments, the method further includes forming a second organic insulating layer on the second conductive pattern and forming a light emitting structure on the second organic insulating layer.

In exemplary embodiments, the conductive pattern includes the first layer, a second layer formed on the first layer, and a third layer formed on the second layer. The first and third layers include titanium, and the second layer includes aluminum.

In exemplary embodiments, the second thickness is equal to or less than 40% that of the first thickness.

In exemplary embodiments, the first metal includes titanium, and the diffusion layer includes titanium, oxygen, and fluorine.

In exemplary embodiments, the first organic insulating layer includes a polyimide-based resin.

According to another exemplary embodiment, a method of manufacturing a display apparatus includes forming a first organic insulating layer on a base substrate, forming a conductive layer that includes a first layer that has a first thickness and that includes a first metal on the first organic insulating layer by using a sputtering scheme, and forming a second conductive pattern by patterning the conductive layer. A diffusion layer that makes contact with the first layer and that includes an oxide of the first metal and that has a second thickness less than the first thickness is formed at an uppermost portion of the first organic insulating layer.

In exemplary embodiments, a plasma having an electric power of 40 kW or less is used in the sputtering scheme.

Therefore, a display apparatus according to exemplary embodiments includes a base substrate, an organic insulating layer disposed on the base substrate, and a conductive pattern disposed on the organic insulating layer. Here, the conductive pattern includes a first layer that includes a first metal and has a first thickness. In addition, a diffusion layer that makes contact with the first layer and that includes an oxide of the first metal and has a second thickness less than the first thickness is formed at an uppermost portion of the organic insulating layer. Accordingly, defects are prevented from occurring in the conductive pattern disposed on the organic insulating layer.

DETAILED DESCRIPTION OF EXEMPLARY EMBODIMENTS

Hereinafter, exemplary embodiments of the present inventive concept will be explained in detail with reference to the accompanying drawings.

Figure 1:
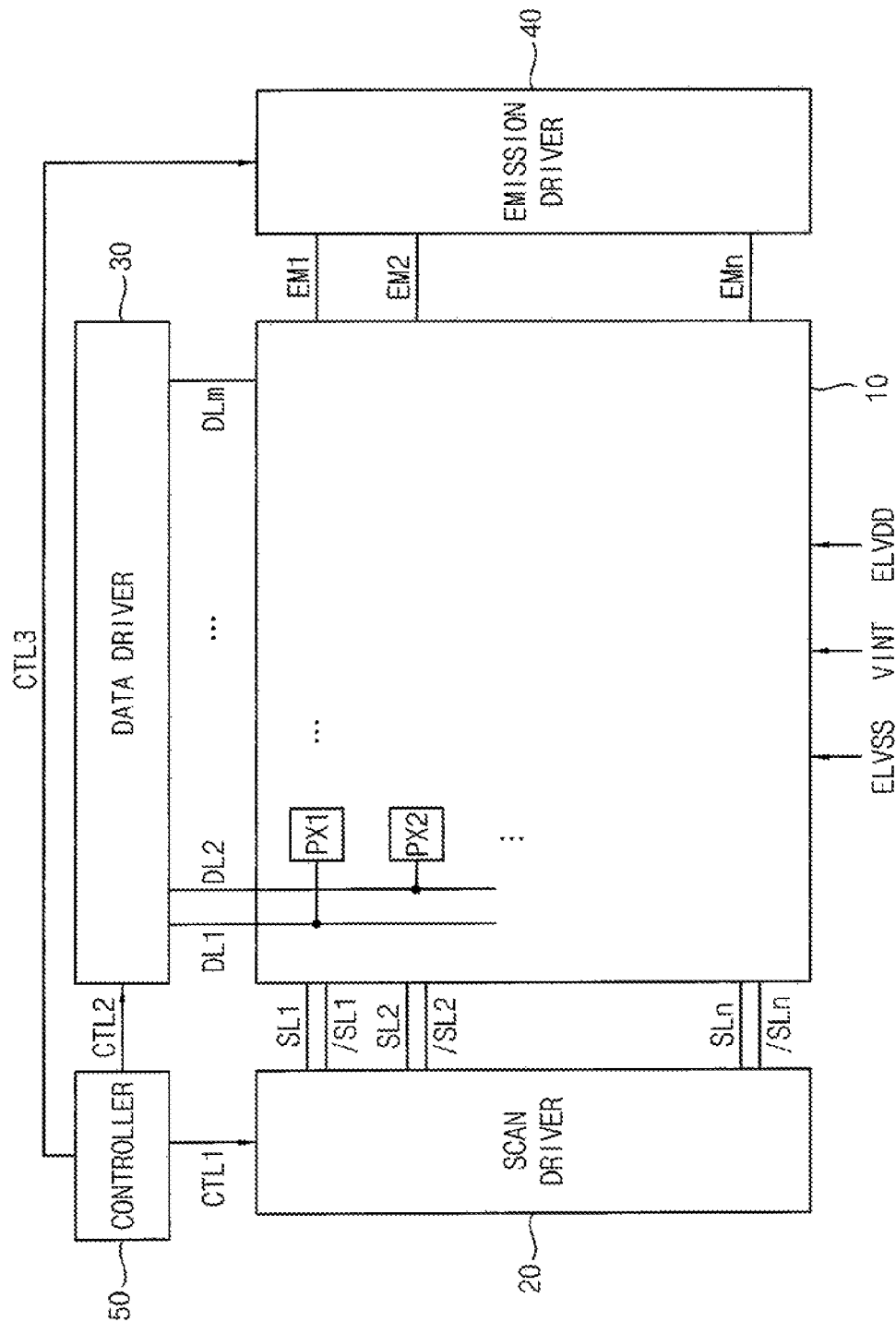
FIG. 1 is a block diagram of a display apparatus according to exemplary embodiments.

FIG. 1 is a block diagram of a display apparatus according to exemplary embodiments.

Referring to FIG. 1, according to an embodiment, a display apparatus includes a display panel 10, a scan driver 20, a data driver 30, an emission control driver 40, and a controller 50.

According to an embodiment, the display panel 10 includes a plurality of pixels PX that display an image. For example, the display panel 10 includes a plurality of pixels PX located at intersections of scan lines SL1 to SLn and data lines DL1 to DLm, where n and m are integers greater than 1, respectively. The structure of the pixel PX will be described in detail with reference to FIG. 4.

According to an embodiment, the scan driver 20 sequentially transmits a first scan signal to the pixels PX through the scan lines SL1 to SLn, and sequentially transmits a second scan signal to the pixels PX through inverted scan lines /SL1 to /SLn based on a first control signal CTL1 received from the controller. For example, the second scan signal is inverted with respect to the first scan signal.

According to an embodiment, the data driver 30 transmits a data signal to the pixels PX through the data lines DL1 to DLm based on a second control signal CTL2 received from the controller.

In this case, according to an embodiment, the data lines include a first data line DL1 and a second data line DL2. The pixels PX include a first pixel PX1 and a second pixel PX2 in the same column. The first data line DL1 is electrically connected to the first pixel PX1, and the second data line DL2 is electrically connected to the second element PX2. Accordingly, two rows of pixels PX can be simultaneously charged.

Accordingly, According to an embodiment, in the case of 120 Hz high-speed driving, a scan load can be increased, so that the scan-on-time (SOT) is reduced and a sufficient compensation time is provided.

According to an embodiment, the emission control driver 40 sequentially transmits an emission control signal to the pixels PX through emission control lines EM1 to EMn based on a third control signal CTL3 received from the controller.

According to an embodiment, the controller 50 controls the scan driver 20, the data driver 30, and the emission control driver 40. The controller 50 generates the control signals CTL1 to CTL3 that respectively control the scan driver 20, the data driver 30, and the emission control driver 40. The first control signal CTL1 for controlling the scan driver 20 includes a scan start signal, a scan clock signal, etc. The second control signal CTL2 for controlling the data driver 30 includes image data, a horizontal start signal, etc. The third control signal CTL3 for controlling the emission control driver 40 includes an emission control start signal, an emission control clock signal, etc.

In addition, According to an embodiment, a display apparatus further includes a power supply unit that supplies a first power supply voltage ELVDD, a second power supply voltage ELVSS, and an initialization voltage VINT to the display panel 10.

Figure 2:
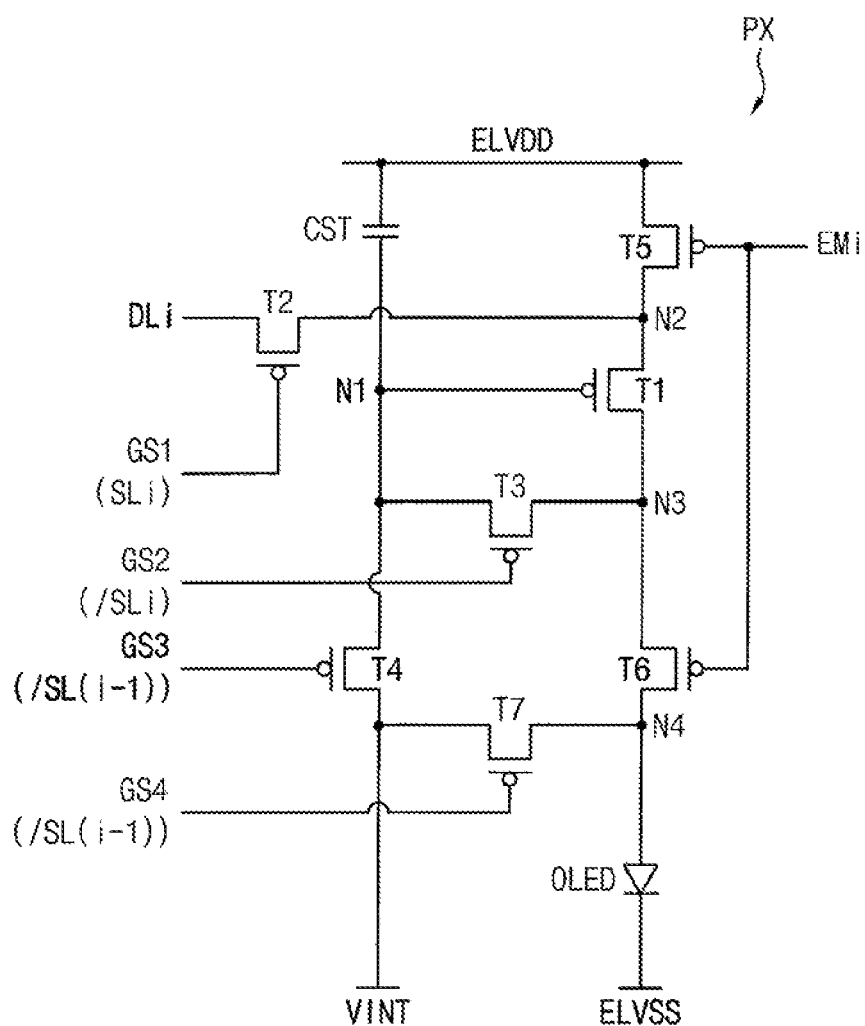
FIG. 2 is an equivalent circuit diagram of a typical pixel included in a display apparatus of FIG. 1.

FIG. 2 is an equivalent circuit diagram of a typical pixel included in a display apparatus of FIG. 1.

Referring to FIG. 2, according to an embodiment, the pixel PX includes first to seventh transistors T1 to T7, a storage capacitor CST, and an organic light emitting diode OLED. A pixel $PX_{i,j}$ would be located in an $i^{th}$ pixel row, where i is an integer between 1 and n, and a $j^{th}$ pixel column, where j is an integer between 1 and m.

According to an embodiment, the first transistor T1 is a driving transistor that provides to the organic light emitting diode OLED a driving current that corresponds to the data signal. The first transistor T1 includes a gate electrode connected to a first node N1, a first electrode connected to a second node N2, and a second electrode connected to a third node N3.

According to an embodiment, the second transistor T2 provides the data signal to the first transistor T1 in response to a first scan signal GS1. In an exemplary embodiment, the second transistor T2 includes a gate electrode that receives the first scan signal GS1 from an $i^{th}$ scan line SLi, a first electrode that receives the data signal from a $j^{th}$ data line DLj, and a second electrode connected to the first electrode of the first transistor T1 through the second node N2.

According to an embodiment, the third transistor T3 connects the second electrode of the first transistor T1 to the gate electrode of the first transistor T1 in response to a second scan signal GS2. In an exemplary embodiment, the third transistor T3 includes a gate electrode that receives the second scan signal GS2 from an $i^{th}$ inverted scan line /SLi, a first electrode connected to the second electrode of the first transistor T1 through the third node N3, and a second electrode connected to the gate electrode of the first transistor T1 through the first node N1.

According to an embodiment, the fourth transistor T4 transmits the initialization voltage VINT to the gate electrode of the first transistor T1 in response to a third scan signal GS3. In an exemplary embodiment, the fourth transistor T4 includes a gate electrode that receives the third scan signal GS3 from an $(i-1)^{th}$ inverted scan line /SL(i-1), a first electrode connected to the initialization voltage VINT, and a second electrode connected to the gate electrode of the first transistor T1 through the first node N1.

According to an embodiment, the fifth transistor T5 transmits the first power supply voltage ELVDD to the first electrode of the first transistor T1 in response to an emission control signal. In an exemplary embodiment, the fifth transistor T5 includes a gate electrode that receives the emission control signal from an $i^{th}$ emission control line EMi, a first electrode connected to the first power supply voltage ELVDD, and a second electrode connected to the first electrode of the first transistor T1 through the second node N2.

According to an embodiment, the sixth transistor T6 connects the second electrode of the first transistor T1 to a first electrode of the organic light emitting diode OLED in response to the emission control signal. In an exemplary embodiment, the sixth transistor T6 includes a gate electrode that receives the emission control signal from the $i^{th}$ emission control line EMi, a first electrode connected to the second electrode of the first transistor T1 through the third node N3, and a second electrode connected to the first electrode of the organic light emitting diode OLED through a fourth node N4.

According to an embodiment, the seventh transistor T7 transmits the initialization voltage VINT to the first electrode of the organic light emitting diode OLED in response to a fourth scan signal GS4. In an exemplary embodiment, the seventh transistor T7 includes a gate electrode that receives the fourth scan signal GS4 from the $(i-1)^{th}$ inverted scan line /SL(i-1), a first electrode connected to the initialization voltage VINT, and a second electrode connected to the first electrode of the organic light emitting diode OLED through the fourth node N4.

In this case, according to an embodiment, each of the first transistor T1, the second transistor T2, the fifth transistor T5, and the sixth transistor T6 is a polysilicon (poly-Si) P-type thin film transistor. Each of the third transistor T3, the fourth transistor T4, and the seventh transistor T7 is an oxide N-type thin film transistor.

According to an embodiment, the storage capacitor CST includes a first electrode connected to the first power supply voltage ELVDD and a second electrode connected to the gate electrode of the first transistor T1 through the first node N1.

Figure 3:
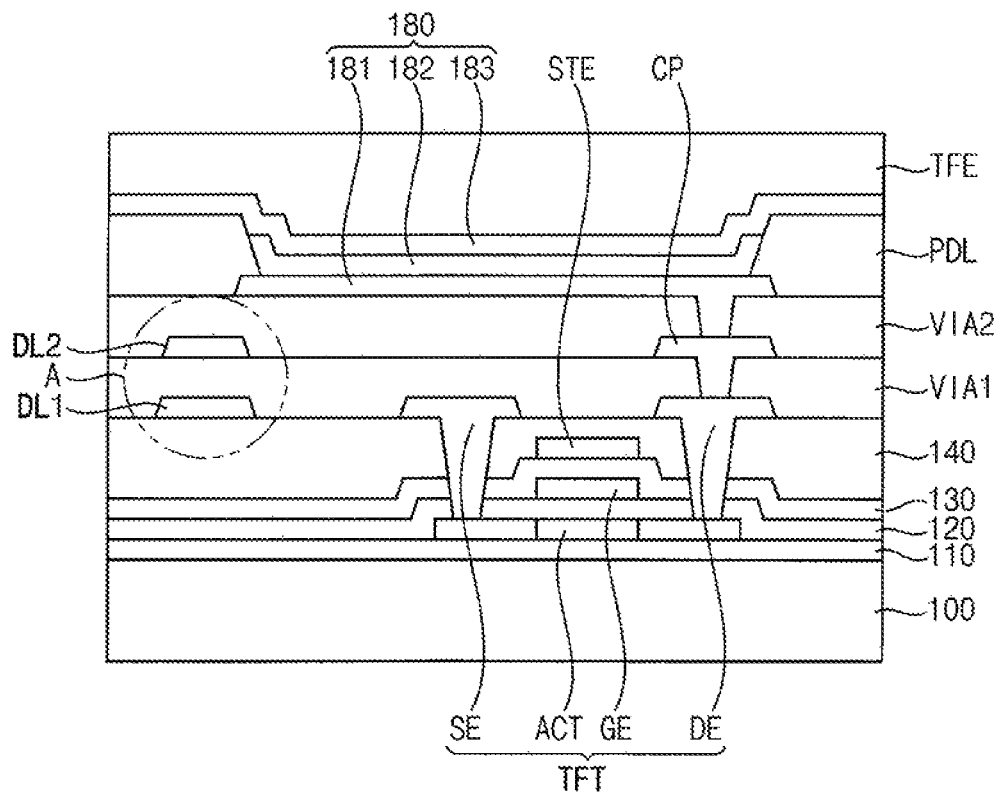
FIG. 3 is a cross-sectional diagram of a display apparatus of FIGS. 1 and 2.

FIG. 3 is a cross-sectional diagram of a display apparatus of FIGS. 1 and 2.

Referring to FIG. 3, according to an embodiment, the display apparatus includes a base substrate 100, a buffer layer 110, an active pattern ACT, a first insulating layer 120, a first gate conductive pattern, a second insulating layer 130, a second gate conductive pattern, a third insulating layer 140, a first source drain conductive pattern, a first organic insulating layer VIA1, a second source drain conductive pattern, a second organic insulating layer VIA2, a pixel defining layer PDL, a light emitting structure 180, and a thin film encapsulation layer TFE.

According to an embodiment, the base substrate 100 may be formed of a transparent or opaque material. For example, the base substrate 100 may be one of a quartz substrate, a synthetic quartz substrate, a calcium fluoride substrate, a fluorine-doped quartz substrate (F-doped quartz substrate), a soda lime glass substrate, or a non-alkali glass substrate, etc. In some exemplary embodiments, the base substrate 100 is a flexible transparent resin substrate. Examples of flexible transparent resin substrate suitable for the base substrate 100 include are polyimide substrates.

According to an embodiment, the buffer layer 110 is disposed over the base substrate 100. The buffer layer 110 prevents metal atoms or impurities from diffusing from the base substrate 100 into the active pattern ACT, and controls a heat transfer rate during a crystallization process that forms the active pattern ACT to obtain a substantially uniform active pattern ACT. In addition, when a surface of the base substrate 100 is not uniform, the buffer layer improves the flatness of the surface of the base substrate 100.

According to an embodiment, the active pattern ACT is disposed on the buffer layer 110. The active pattern ACT includes poly crystal silicon. The active pattern ACT includes a drain region and a source region that are doped with impurities, and a channel region disposed between the drain region and the source region. The poly crystal silicon is formed by depositing amorphous silicon and crystallizing the amorphous silicon. In another exemplary embodiment, the active pattern ACT includes an oxide semiconductor. The oxide semiconductor is a semiconductor oxide layer that includes a binary compound ($AB_x$), a ternary compound ($AB_xC_y$), or a quaternary compound ($AB_xC_yD_z$), that contain indium (In), zinc (Zn), gallium (Ga), tin (Sn), titanium (Ti), aluminum (Al), hafnium (Hf), zirconium (Zr), or magnesium (Mg), etc.

According to an embodiment, the first insulating layer 120 may be disposed on the buffer layer 110 on which the active pattern ACT is disposed. The first insulating layer 120 covers the active pattern ACT. The first insulating layer 120 includes an inorganic insulating material such as a silicon compound or a metal oxide.

According to an embodiment, the first gate conductive pattern is disposed on the first insulating layer 120. The first gate conductive pattern includes a gate electrode GE. The first gate conductive pattern further includes a signal wire such as a gate line that drives the display apparatus. The first gate conductive pattern is formed from a metal, an alloy, a metal nitride, a conductive metal oxide, or a transparent conductive material, etc.

According to an embodiment, the second insulating layer 130 is disposed on the first insulating layer 120 on which the first gate conductive pattern is disposed. The second insulating layer 130 covers the first gate conductive pattern. The second insulating layer 130 includes an inorganic insulating material such as a silicon compound or a metal oxide.

According to an embodiment, the second gate conductive pattern is disposed on the second insulating layer 130. The second gate conductive pattern includes a storage electrode STE and a signal line. The storage electrode STE overlaps the gate electrode GE to form a storage capacitor. The second gate conductive pattern is formed from a metal, an alloy, a metal nitride, a conductive metal oxide, or a transparent conductive material, etc.

According to an embodiment, the third insulating layer 140 is disposed on the second insulating layer 130 on which the second gate conductive pattern is disposed. The third insulating layer 140 covers the second gate conductive pattern on the second insulating layer 130, and provides a flat top surface without creating a step around the second gate conductive pattern. The third insulating layer 140 includes an inorganic insulating material such as a silicon compound or a metal oxide.

According to an embodiment, the first source drain conductive pattern is disposed on the third insulating layer 140. The first source drain conductive pattern includes a source electrode SE, a drain electrode DE, and a first data line DLL. The first source drain conductive pattern is formed from a metal, an alloy, a metal nitride, a conductive metal oxide, or a transparent conductive material, etc. The first source drain conductive pattern includes a plurality of layers. For example, the first source drain conductive pattern includes a titanium (Ti) layer and a molybdenum (Mo) layer disposed on the titanium layer to form a Ti/Mo structure. Alternatively, the first source drain conductive pattern includes a titanium (Ti) layer, an aluminum (Al) layer disposed on the titanium layer, and a titanium (Ti) layer disposed on the aluminum layer to from a Ti/Al/Ti structure.

According to an embodiment, the active pattern ACT, the gate electrode GE, the source electrode SE, and the drain electrode DE form the thin film transistor TFT.

According to an embodiment, the thin film transistor TFT has a top gate structure, but embodiments are not limited thereto, and in other embodiments, the thin film transistor TFT has a bottom gate structure.

According to an embodiment, the first organic insulating layer VIA1 is disposed on the third insulating layer 140 on which the first source drain conductive pattern is disposed. The first organic insulating layer VIA1 covers the first source drain conductive pattern. The first organic insulating layer VIA1 may have a single-layer structure, or may also have a multilayer structure that includes at least two insulating layers. The first organic insulating layer VIA1 is formed from an organic material such as a photoresist, an acryl-based resin, a polyimide-based resin, a polyamide-based resin, or a siloxane-based resin.

According to an embodiment, the second source drain conductive pattern is disposed on the first organic insulating layer VIA1. The second source drain conductive pattern includes a contact pad CP and a second data line DL2. The second data line DL2 at least partially overlaps the first data line DL1. The second source drain conductive pattern is formed from a metal, an alloy, a metal nitride, a conductive metal oxide, or a transparent conductive material, etc. The second source drain conductive pattern is formed of a plurality of layers. For example, the second source drain conductive pattern includes a titanium (Ti) layer and a molybdenum (Mo) layer disposed on the titanium layer to form a Ti/Mo structure. Alternatively, the second source drain conductive pattern includes a titanium (Ti) layer, an aluminum (Al) layer disposed on the titanium layer, and a titanium (Ti) layer disposed on the aluminum layer to form a Ti/Al/Ti structure.

According to an embodiment, the second organic insulating layer VIA2 is disposed on the first organic insulating layer VIA1 on which the second source drain conductive pattern is disposed. The second organic insulating layer VIA2 covers the second source drain conductive pattern. The second organic insulating layer VIA2 may have a single-layer structure, or may also have a multilayer structure that includes at least two insulating layers. The second organic insulating layer VIA2 is formed from an organic material such as a photoresist, an acryl-based resin, a polyimide-based resin, a polyamide-based resin, or a siloxane-based resin.

According to an embodiment, the light emitting structure 180 includes a first electrode 181, a light emitting layer 182, and a second electrode 183.

According to an embodiment, the first electrode 181 is disposed on the second organic insulating layer VIA2. Depending on a light emitting scheme of the display apparatus, the first electrode 181 is formed from either a reflective material or a transmissive material. In exemplary embodiments, the first electrode 181 may have a single-layer structure or a multilayer structure that includes at least one of a metal film, an alloy film, a metal nitride film, a conductive metal oxide film, or a transparent conductive material film.

According to an embodiment, the pixel defining layer PDL is disposed on the second organic insulating layer VIA2 on which the first electrode 181 is disposed. The pixel defining layer PDL is formed from an organic material or an inorganic material, etc. For example, the pixel defining layer PDL is formed from a photoresist, a polyacryl-based resin, a polyimide-based resin, an acryl-based resin, or a silicon compound, etc. In exemplary embodiments, the pixel defining layer PDL is etched to form an opening which partially exposes the first electrode 181. An emission area and a non-emission area of the display apparatus are defined by the opening of the pixel defining layer PDL. For example, a portion where the opening of the pixel defining layer PDL is located corresponds to the emission area, and the non-emission area corresponds to a portion adjacent to the opening of the pixel defining layer PDL.

According to an embodiment, the light emitting layer 182 is disposed on portion of the first electrode 181 that is exposed through the opening of the pixel defining layer PDL. In addition, the light emitting layer 182 extends onto a side wall of the opening of the pixel defining layer PDL. In exemplary embodiments, the light emitting layer 182 has a multilayer structure that includes an organic light emitting layer EL, a hole injection layer HIL, a hole transport layer HTL, an electron transport layer ETL, and an electron injection layer EIL, etc. In another exemplary embodiment, the layers of the light emitting layer 182 except for the organic light emitting layer, i.e., the hole injection layer, the hole transport layer, the electron transport layer, and the electron injection layer, are commonly formed to correspond to the plurality of pixels. The organic light emitting layer of the light emitting layer 182 is formed from light emitting materials that generate different colors, such as red light, green light, or blue light according to each pixel of the display apparatus. According to some exemplary embodiments, the organic light emitting layer of the light emitting layer 182 has a structure in which a plurality of light emitting materials for emitting different colored light, such as red light, green light, and blue light, are stacked to emit white light. In this case, the above light emitting structures are commonly formed to correspond to the pixels, and the pixels are classified by a color filter layer.

According to an embodiment, the second electrode 183 is disposed on the pixel defining layer PDL and the light emitting layer 182. Depending on a light emitting scheme of the display apparatus, the second electrode 183 may include a transmissive material or a reflective material. In exemplary embodiments, the second electrode 183 may also have a single-layer structure or a multilayer structure that includes at least one of a metal film, an alloy film, a metal nitride film, a conductive metal oxide film, or a transparent conductive material film.

According to an embodiment, the thin film encapsulation layer TFE is disposed on the second electrode 183. The thin film encapsulation layer TFE prevents external moisture and oxygen from penetrating into the display apparatus. The thin film encapsulation layer TFE includes at least one organic layer and at least one inorganic layer. The at least one organic layer and the at least one inorganic layer are alternately stacked on each other. For example, the thin film encapsulation layer TFE includes two inorganic layers and one organic layer disposed therebetween, but embodiments are not limited thereto. In another exemplary embodiment, a sealing substrate is provided instead of the thin film encapsulation layer to block external air and moisture from penetrating into the display apparatus.

Figure 4:
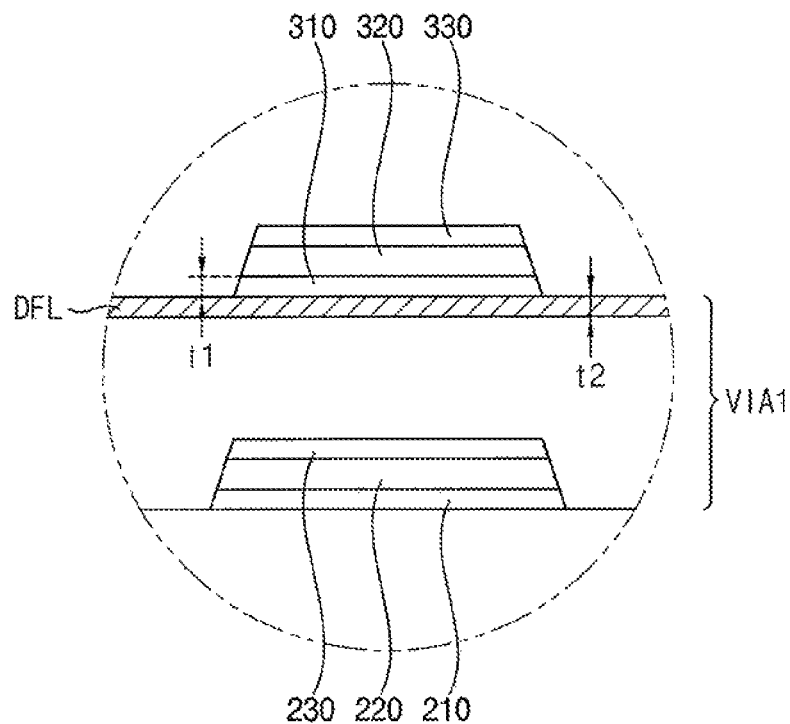
FIG. 4 is an enlarged diagram of portion 'A' in FIG. 3.

FIG. 4 is an enlarged diagram of portion 'A' in FIG. 3.

Referring to FIGS. 3 and 4, according to an embodiment, the first source drain conductive pattern includes a plurality of layers. For example, the first source drain conductive pattern includes a first layer 210 that includes titanium, a second layer 220 disposed on the first layer 210 and that includes aluminum, and a third layer 230 disposed on the second layer 220 and that includes titanium.

According to an embodiment, the second source drain conductive pattern includes a first layer 310, a second layer 320, and a third layer 330. The first layer 310 includes a first metal and has a first thickness t1. The first metal includes titanium. The second layer 320 is disposed on the first layer 310. The second layer 320 includes aluminum. The third layer 330 is disposed on the second layer 320. The third layer 330 includes titanium.

According to an embodiment, a diffusion layer DFL is formed on an uppermost portion of the first organic insulating layer VIA1 and under the first layer 310. The diffusion layer DFL includes an oxide of the first metal and has a second thickness t2 less than the first thickness t1. For example, the diffusion layer DFL includes titanium, oxygen, and fluorine.

According to an embodiment, the second thickness t2 is less than or equal to about 40% that of the first thickness t. When the diffusion layer DFL is too thick, a portion of the first layer 310, which is removed when patterning the second source drain conductive pattern that includes the first layer 310 through an etching process, may remain without being removed due to strong bonding with the diffusion layer DFL so as to form a residue pattern, thereby causing defects. Therefore, the diffusion layer DFL may be minimized, and the second thickness t2 of the diffusion layer DFL may be equal to or less than 40% that of the first thickness t1.

FIGS. 5A to 5I are cross-sectional diagrams and enlarged diagrams of portion 'A' that illustrate a method of manufacturing the display apparatus of FIG. 3.

Figure 5A:
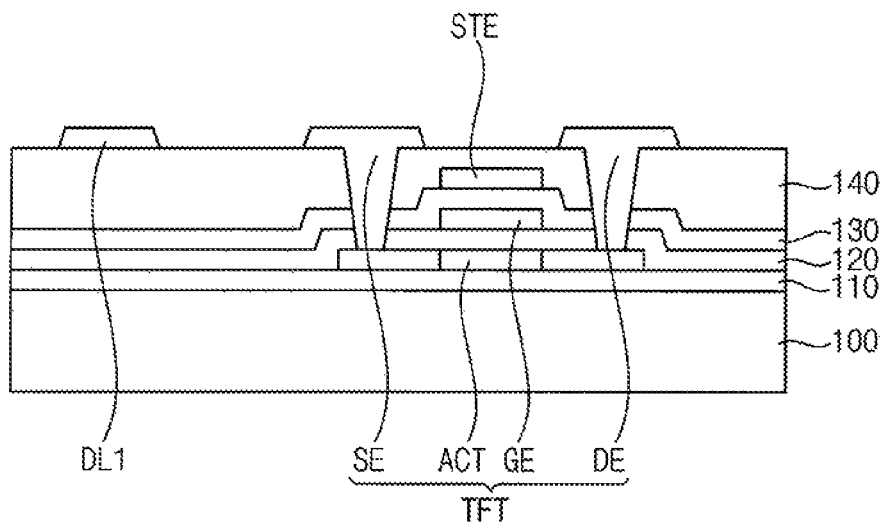
FIGS. 5A to 5I are cross-sectional diagrams and enlarged diagrams of portion 'A' that illustrate a method of manufacturing the display apparatus of FIG. 3.

Referring to FIG. 5A, according to an embodiment, a buffer layer 110 is formed on a base substrate 100. An active pattern ACT of a thin film transistor TFT is formed on the buffer layer 110. A first insulating layer 120 is formed on the buffer layer 110 and the active pattern ACT. A first gate conductive pattern that includes a gate electrode GE of the thin film transistor TFT is formed on the first insulating layer 120. A second insulating layer 130 is formed on the first insulating layer 120 and the first gate conductive pattern. A second gate conductive pattern that includes a storage electrode STE is formed on the second insulating layer 130. A third insulating layer 140 is formed on the second insulating layer 130 and the second gate conductive pattern.

According to an embodiment, a first source drain conductive pattern that includes a source electrode SE and a drain electrode DE of the thin film transistor TFT and a first data line DL1 is formed on the third insulating layer 140. The first source drain conductive pattern includes a plurality of layers. For example, the first source drain conductive pattern includes a first layer that includes titanium, a second layer disposed on the first layer and that includes aluminum, and a third layer disposed on the second layer and that includes titanium.

Figure 5B:
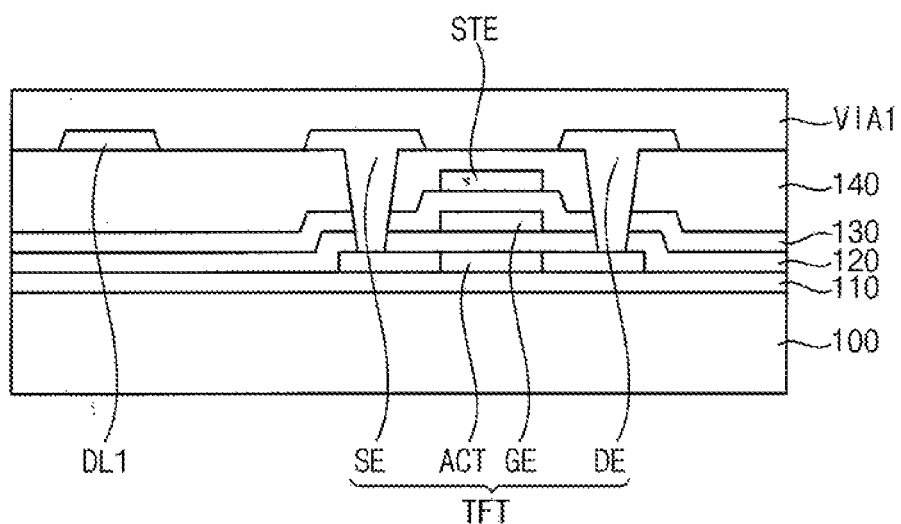

Referring to FIG. 5B, according to an embodiment, a first organic insulating layer VIA1 is formed on the third insulating layer 140 and the first source drain conductive pattern. The first organic insulating layer VIA1 includes a polyimide-based resin. After the first organic insulating layer VIA1 is formed, a top surface of the first organic insulating layer VIA1 is cleaned by using a cleaning fluid. For example, the top surface of the first organic insulating layer VIA1 is cleaned by using de-ionized water (DI water), etc.

Figure 5C:
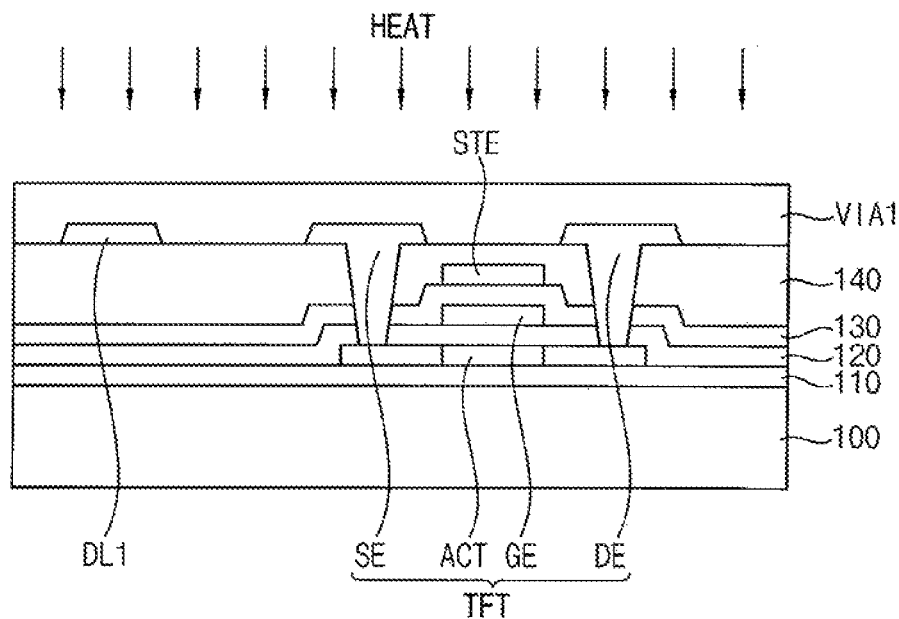

Referring to FIG. 5C, according to an embodiment, the top surface of the first organic insulating layer VIA1 is heat-treated by applying heat to the top surface of the first organic insulating layer VIA1. In this case, the top surface of the first organic insulating layer VIA1 is heat-treated at a temperature between 60 degrees and 150 degrees for a time of 16 seconds or more. Accordingly, foreign substances, such as any cleaning fluid remaining on the top surface of the first organic insulating layer VIA1, are removed without degrading characteristics of the display apparatus.

Figure 5D:
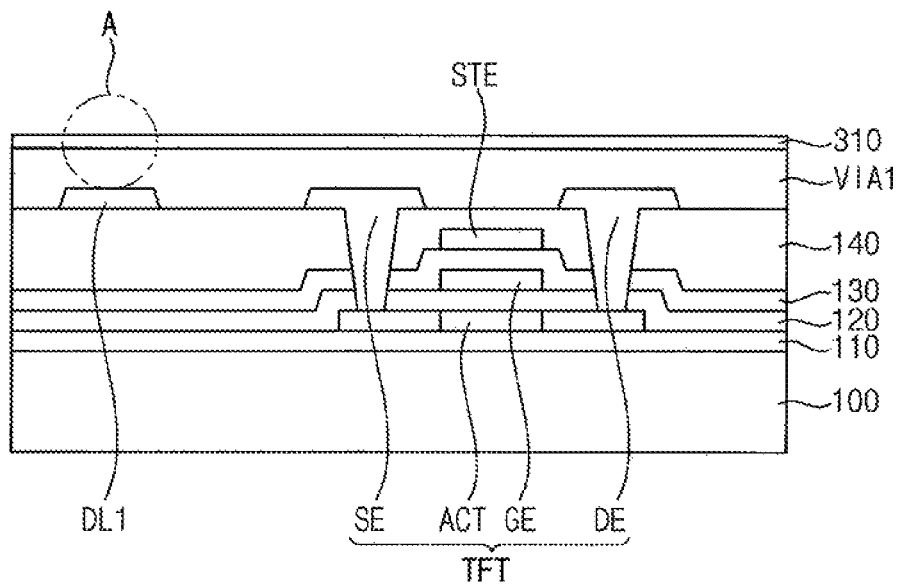
Figure 5E:
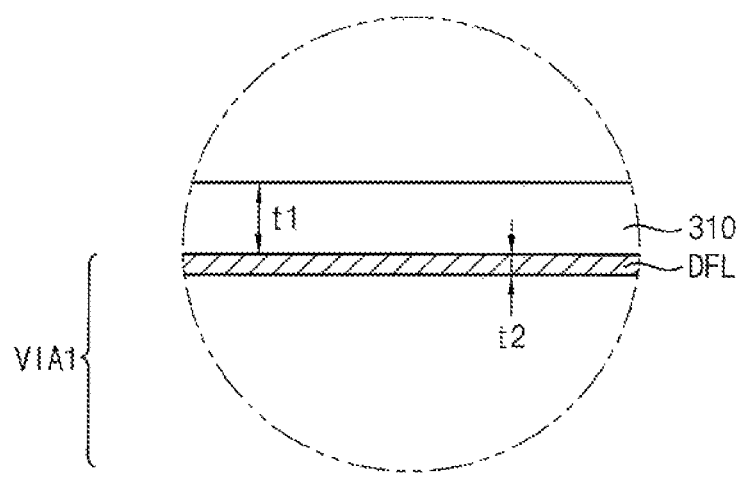

Referring to FIGS. 5D and 5E, according to an embodiment, a first layer 310 is formed on the first organic insulating layer VIA1. The first layer 310 has a first thickness t1 and includes a first metal. The first metal includes titanium. The first layer 310 is formed by a sputtering scheme. In this case, the first metal of the first layer 310 diffuses into the first organic insulating layer VIA1. Accordingly, a diffusion layer DFL that includes an oxide of the first metal and has a second thickness t2 less than the first thickness is formed at an uppermost portion of the first organic insulating layer VIA1, which makes contact with the first layer 310. The diffusion layer DFL includes the first metal, oxygen, and fluorine. For example, when the first metal includes titanium, the diffusion layer DFL includes a compound ($TiO_xF_y$) that includes titanium, oxygen, and fluorine.

According to an embodiment, the second thickness t2 is equal or less than 40% that of the first thickness t1. For example, the second thickness t2 is 26% to 28% that of the first thickness t1. In an exemplary embodiment, the first thickness t1 is from about 41 nm to about 45 nm (nanometer), and the second thickness t2 is 15 nm or less. For example, the second thickness is 12 nm.

Figure 5F:
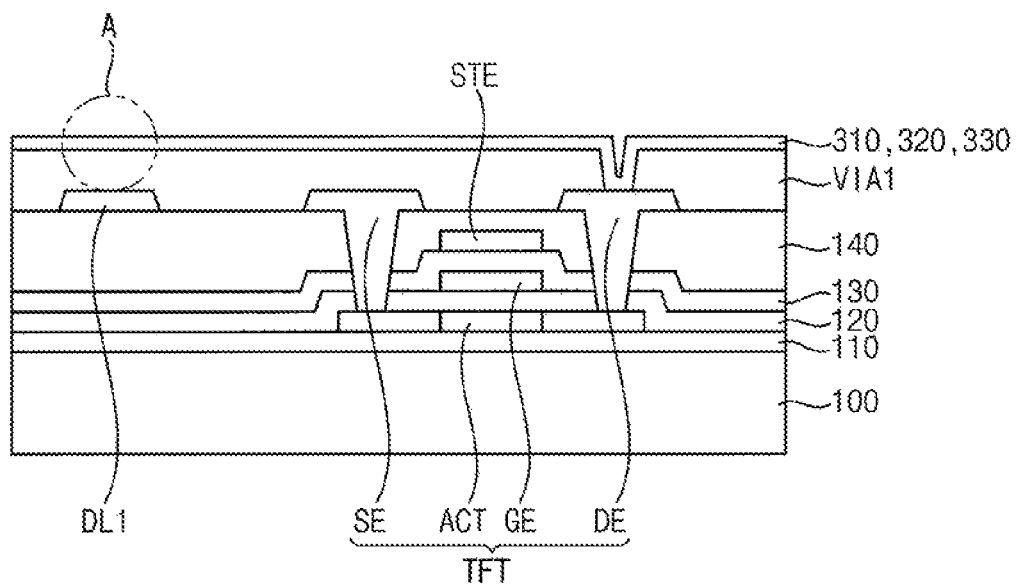
Figure 5G:
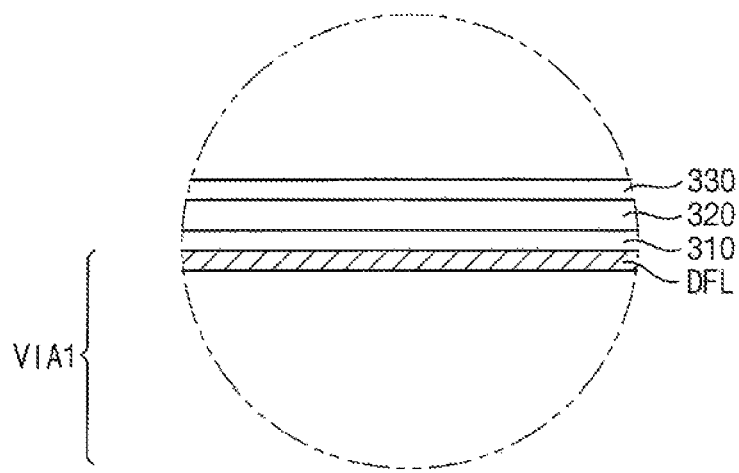

Referring to FIGS. 5F and 5G, according to an embodiment, a second layer 320 and a third layer 330 are sequentially formed on the first layer 310. The second layer 320 and the third layer 330 are continuously formed subsequent to forming the first layer 310, and are formed by another sputtering scheme. The second layer 320 includes aluminum. The third layer 330 includes titanium.

Figure 5H:
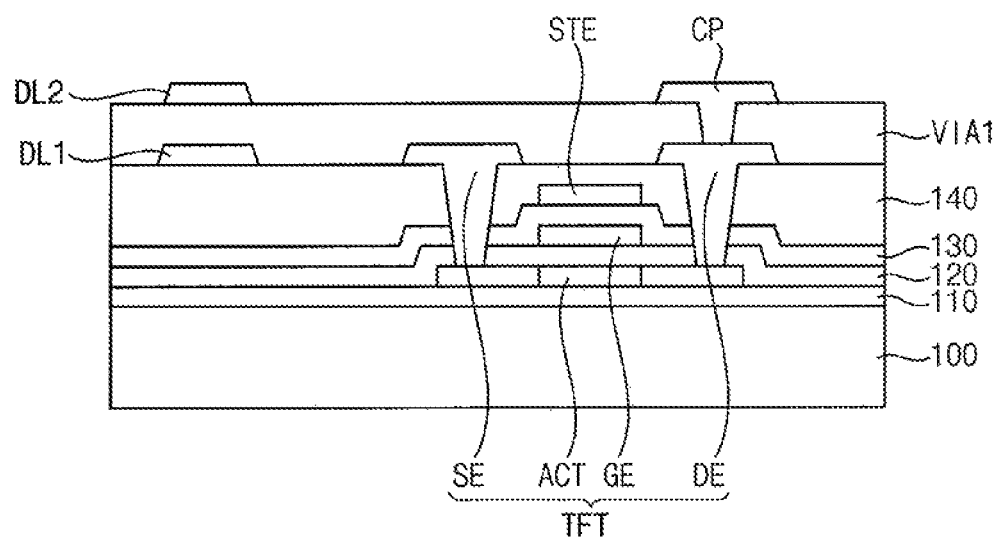

Referring to FIG. 5H, according to an embodiment, a second source drain conductive pattern that includes a second data line DL2 and a contact pad CP is formed by patterning the first to third layers 310, 320, and 330. For example, the second source drain conductive pattern is formed by a photolithography process or an etching process that uses an additional etching mask.

According to an embodiment, since the second thickness t2 of the diffusion layer DFL is less than or equal to 40% of the first thickness t1 of the first layer 310, it is possible to remove all of those portions of the first layer 310 that are to be removed during the patterning process, which prevents a residue pattern that causes defects.

Figure 5I:
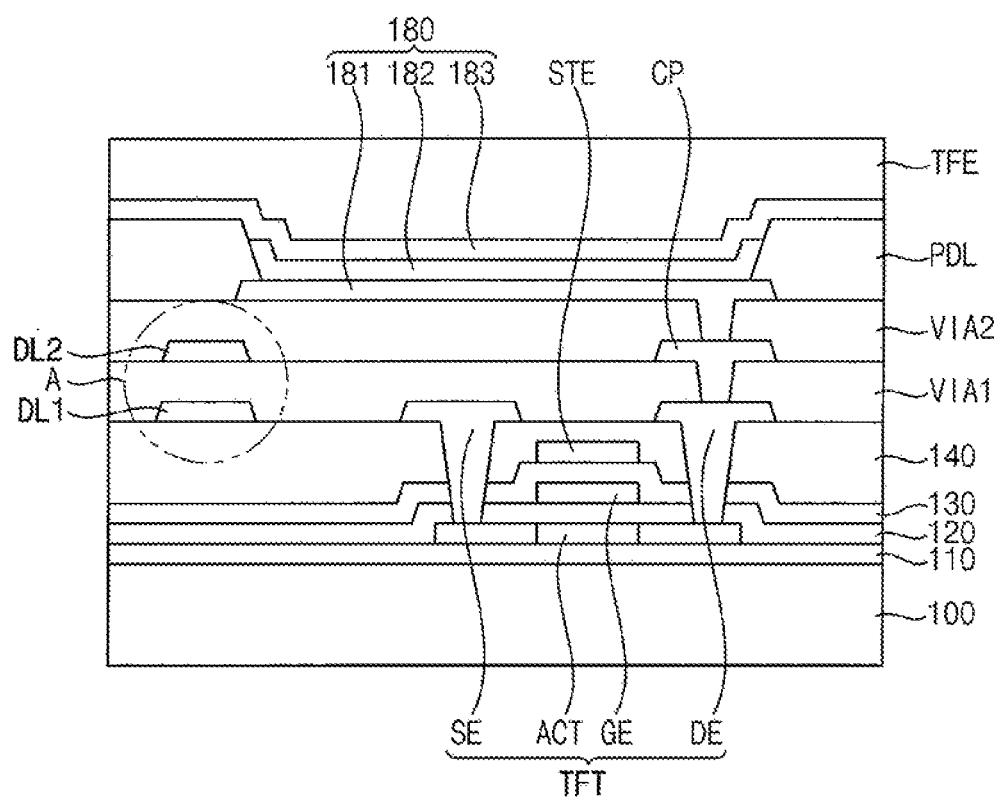

Referring to FIG. 5I, according to an embodiment, a second organic insulating layer VIA2 is formed on the second source drain conductive pattern. A first electrode 181 of a light emitting structure 180 is formed on the second organic insulating layer VIA2. A pixel defining layer PDL is formed on the second organic insulating layer VIA2 and on edges of the first electrode 181. A light emitting layer 182 of the light emitting structure 180 is formed on the first electrode 181, and a second electrode 183 of the light emitting structure 180 is formed on the light emitting layer 182 and the pixel defining layer PDL. A thin film encapsulation layer TFE is formed on the light emitting structure 180. Accordingly, a display apparatus according to an embodiment is manufactured.

Figure 6A:
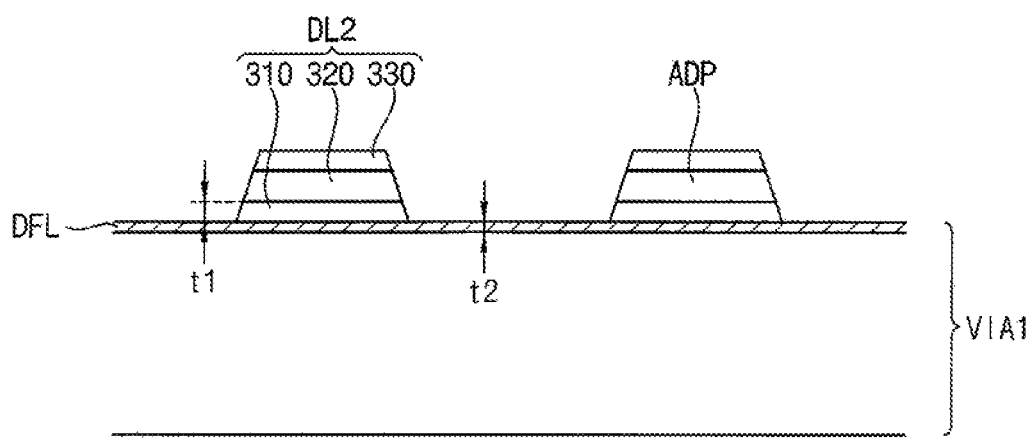
FIG. 6A is a cross-sectional diagram that illustrates an effect of a display apparatus according to exemplary embodiments.
Figure 6B:
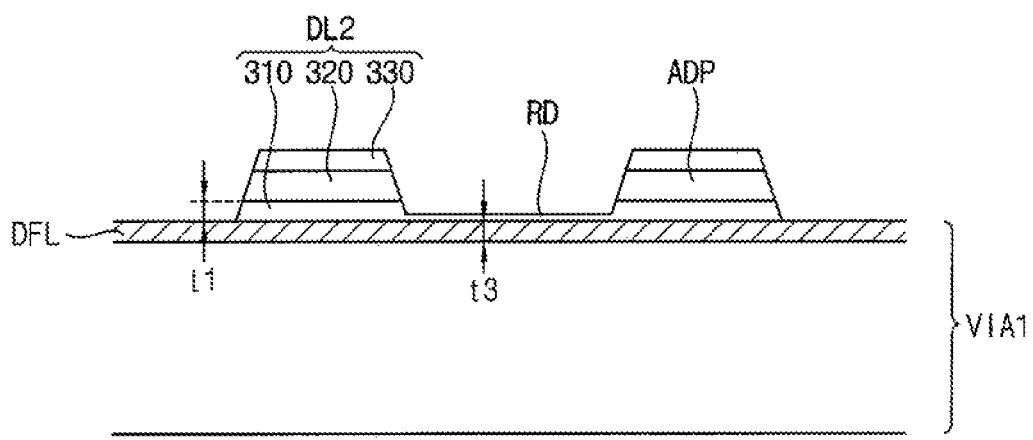
FIG. 6B is a cross-sectional diagram that illustrates a defect generated in a display apparatus according to a comparative example.

FIG. 6A is a cross-sectional diagram that illustrates an effect of a display apparatus according to exemplary embodiments, and FIG. 6B is a cross-sectional diagram that illustrates a defect generated in a display apparatus according to a comparative example.

Referring to FIG. 6A, according to an embodiment, since the diffusion layer DFL has the second thickness t2 less than the first thickness t1 of the first layer 310 of the second source drain conductive pattern, no residue pattern is formed between adjacent patterns ADJ while etching the first layer 310, so that defect can be prevented.

In contrast, referring to FIG. 6B, according to a comparative example, the top surface of the first organic insulating layer VIA1 is not heated after the first organic insulating layer VIA1 is formed, so that the diffusion layer DFL has a third thickness t3 greater than the second thickness t2.

Accordingly, a residue pattern RD forms between the adjacent patterns ADJ while etching the first layer 310, thereby causing defects.

It was found that a titanium oxide ($TiO_x$) component of the diffusion layer DFL is more strongly bonded with the polyimide-based resin than titanium (Ti), thereby contributing to the formation of the residue pattern during the etching process.

Figure 7A:
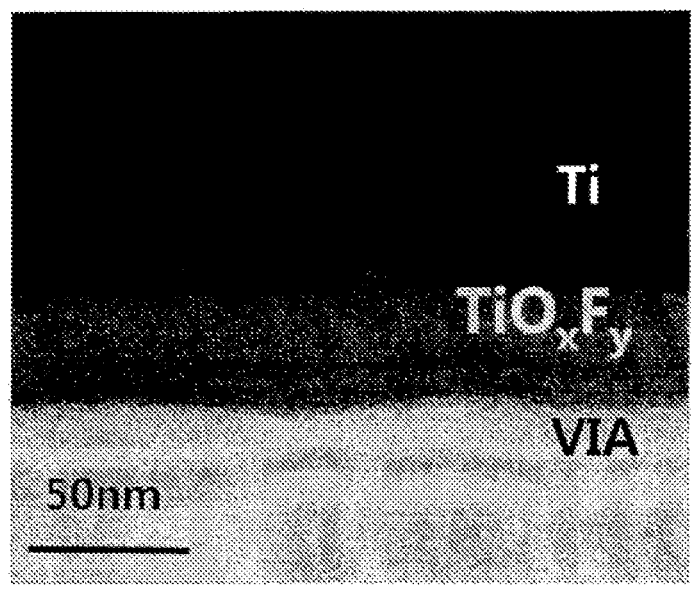
FIG. 7A is a micrograph of a section of a diffusion layer of a display apparatus according to a comparative example.
Figure 7B:
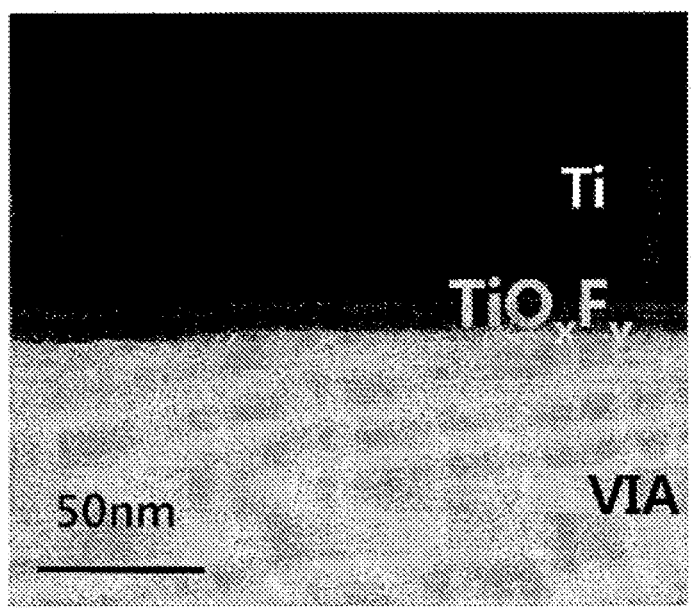
FIG. 7B is a micrograph of a section of a diffusion layer of a display apparatus according to an exemplary embodiment.
Figure 7C:
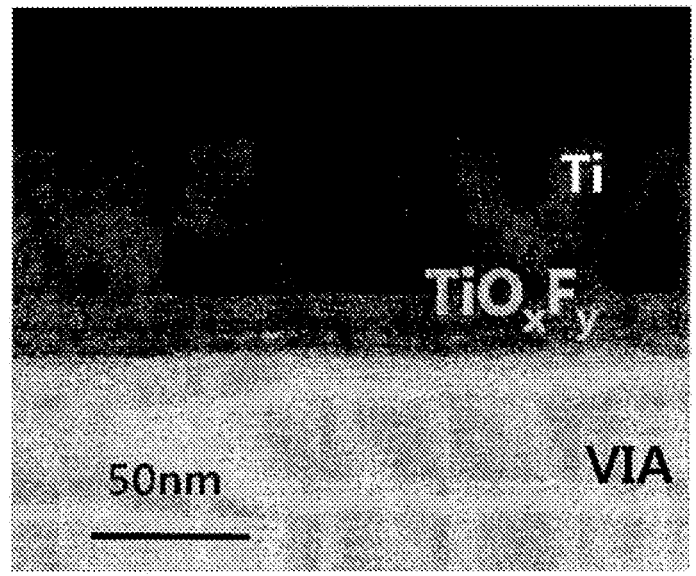
FIG. 7C is a micrograph of a section of a diffusion layer of a display apparatus according to another exemplary embodiment.

FIG. 7A is a micrograph of a section of a diffusion layer of a display apparatus according to a comparative example, FIG. 7B is a micrograph of a section of a diffusion layer of a display apparatus according to an exemplary embodiment, and FIG. 7C is a micrograph of a section of a diffusion layer of a display apparatus according to another exemplary embodiment.

Referring to FIG. 7A, according to a comparative example in which no heat treatment process is performed, it is found that a relatively thick $TiO_xF_y$ component layer, which is part of a diffusion layer formed on an uppermost portion of an organic insulating layer VIA, is formed between the organic insulating layer VIA and a titanium layer Ti.

Referring to FIG. 7B, according to an exemplary embodiment in which a heat treatment process is performed, it is found that the $TiO_xF_y$ component layer, which is the diffusion layer, is relatively thin as compared with the comparative example.

Figure 12:
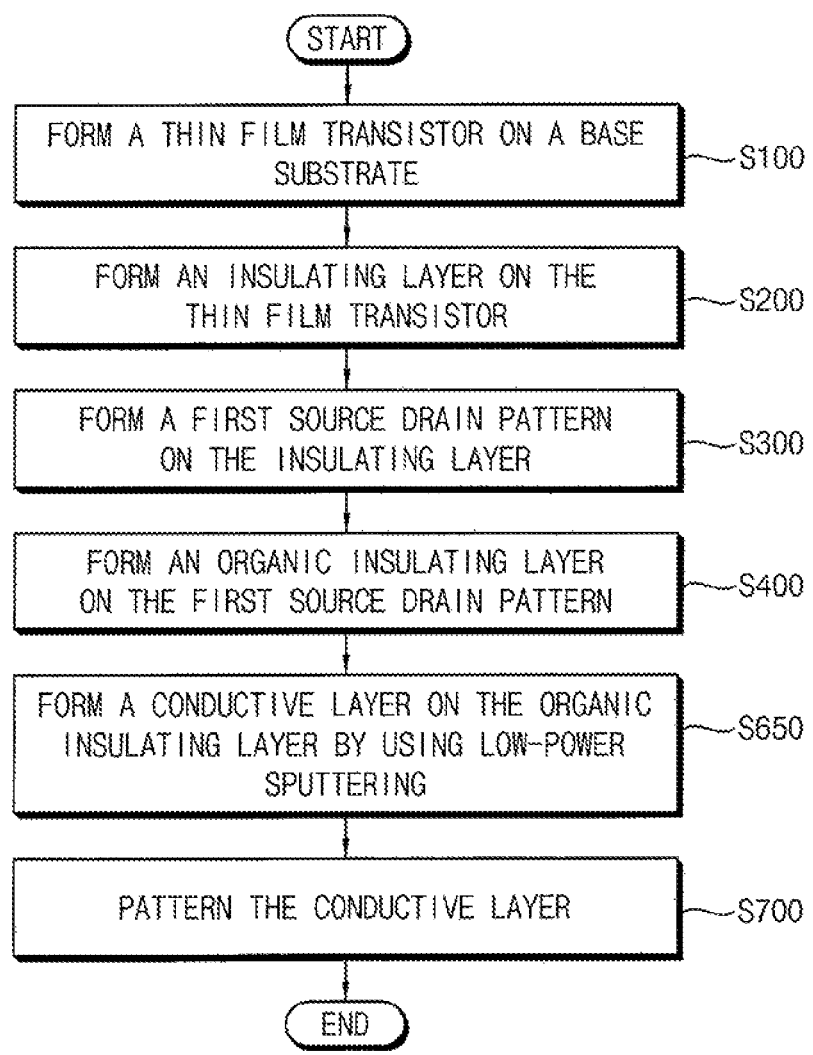
FIG. 12 is a flowchart of a method of manufacturing a display apparatus according to exemplary embodiments.

Referring to FIG. 7C, according to another exemplary embodiment in which a low-power sputtering process is performed, it is found that the $TiO_xF_y$ component layer, which is the diffusion layer, is relatively thin as compared with the comparative example (see description of FIG. 12).

FIGS. 8A to 8D are micrographs of sections of diffusion layers of a display apparatus according to exemplary embodiments under various conditions.

Figure 8A:
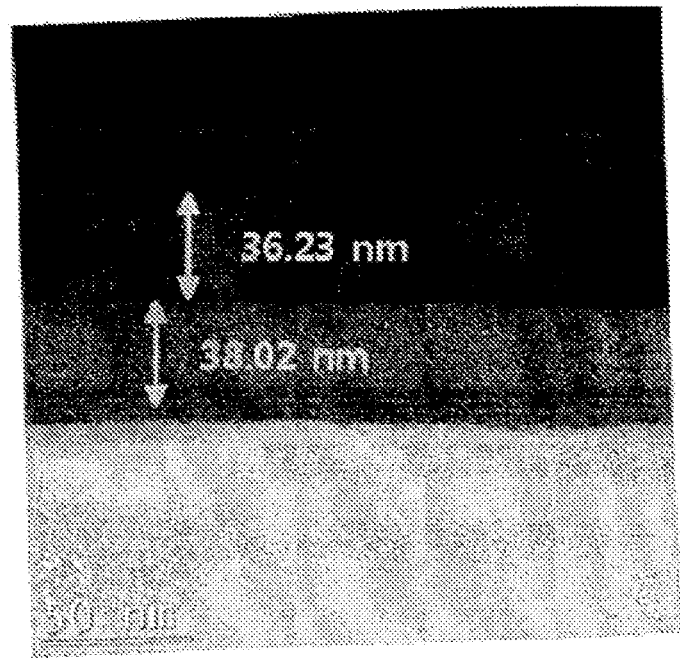
FIGS. 8A to 8D are micrographs of sections of diffusion layers of a display apparatus according to exemplary embodiments under various conditions.
Figure 8B:
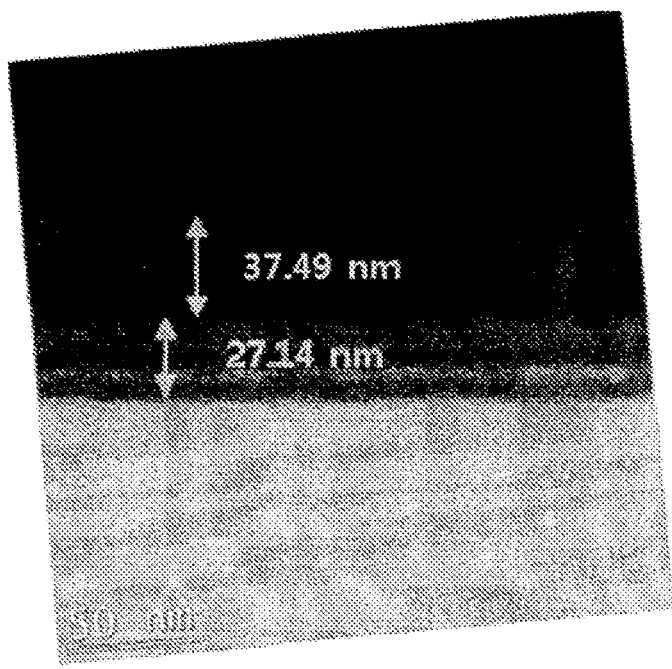

According to embodiments, FIGS. 8A and 8B show cases where the heat treatment process is performed at 80 degrees for 16 seconds under mutually different conditions. According to FIG. 8A, the first thickness of the first layer was 36.23 nm, and the second thickness of the diffusion layer was 38.02 nm. According to FIG. 8B, the first thickness of the first layer was 37.49 nm, and the second thickness of the diffusion layer was 27.14 nm.

Figure 8C:
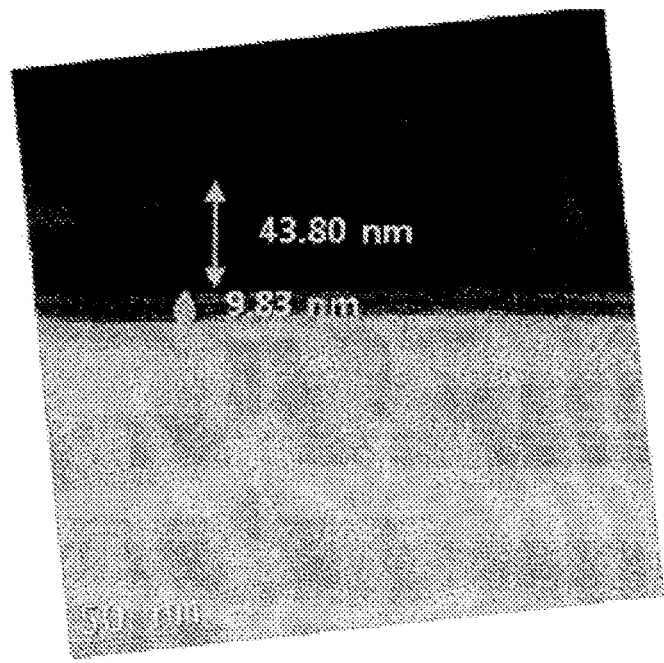
Figure 8D:
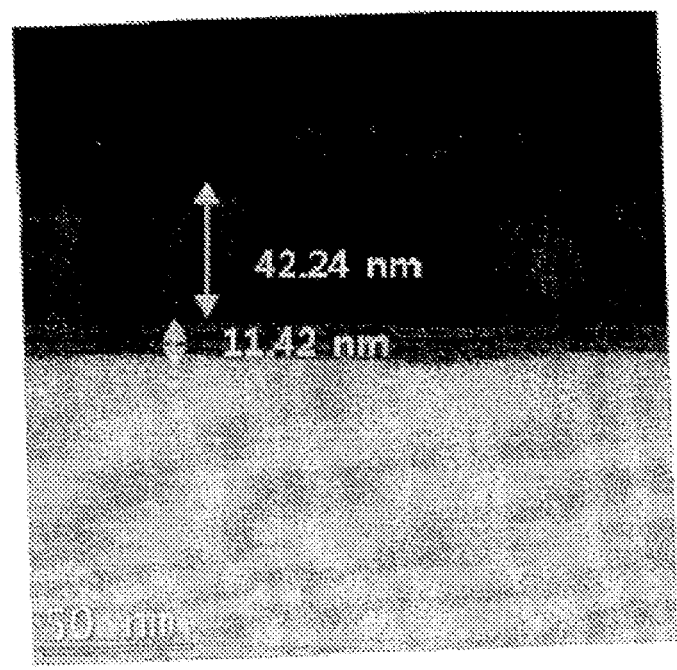

According to embodiments, FIGS. 8C and 8D show cases where the heat treatment process is performed at 80 degrees for 32 seconds under mutually different conditions. According to FIG. 8C, the first thickness of the first layer was 43.80 nm, and the second thickness of the diffusion layer was 9.83 nm. According to FIG. 8D, the first thickness of the first layer was 42.24 nm, and the second thickness of the diffusion layer was 11.42 nm.

Accordingly, according to embodiments, it was found that the heat treatment process can be performed at a temperature of from 60 degrees to 150 degrees for a time of 16 seconds or more. For example, the heat treatment process can be performed at 80 degrees for a time of from 16 seconds to 45 seconds.

Figure 9A:
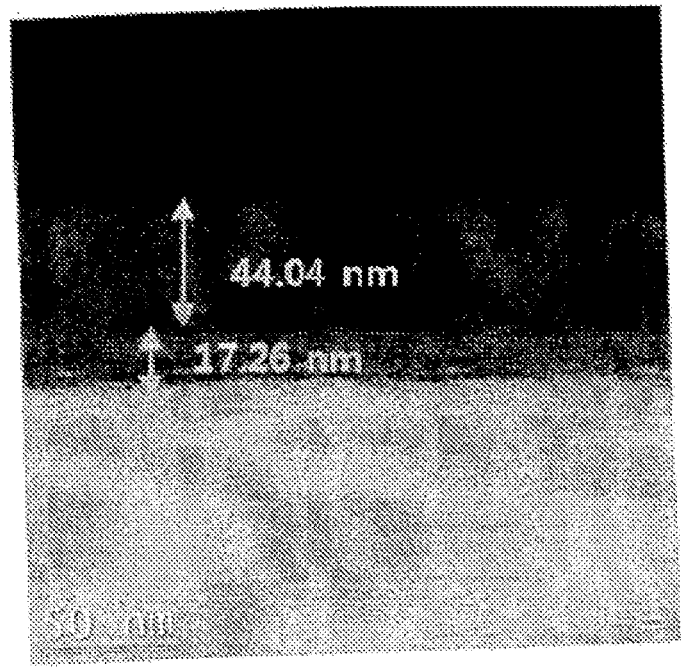
FIGS. 9A and 9B are micrographs of sections of diffusion layers of a display apparatus according to exemplary embodiments under various conditions.
Figure 9B:
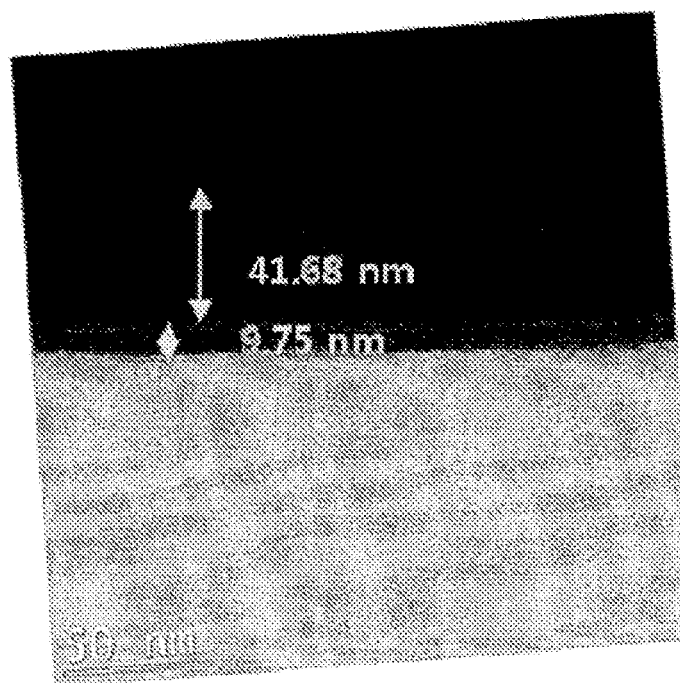

FIGS. 9A and 9B are micrographs of sections of diffusion layers of a display apparatus according to exemplary embodiments under various conditions.

According to embodiments, FIGS. 9A and 9B show cases where the first layer is formed by using a low-power sputtering scheme under mutually different conditions. Plasma having an electric power of 30 kW is used in the sputtering scheme (see description of FIG. 12).

According to FIG. 9A, according to an embodiment, the first thickness of the first layer was 44.04 nm, and the second thickness of the diffusion layer was 17.26 nm.

According to FIG. 9B, according to an embodiment, the first thickness of the first layer was 41.68 nm, and the second thickness of the diffusion layer was 9.75 nm.

Figure 10A:
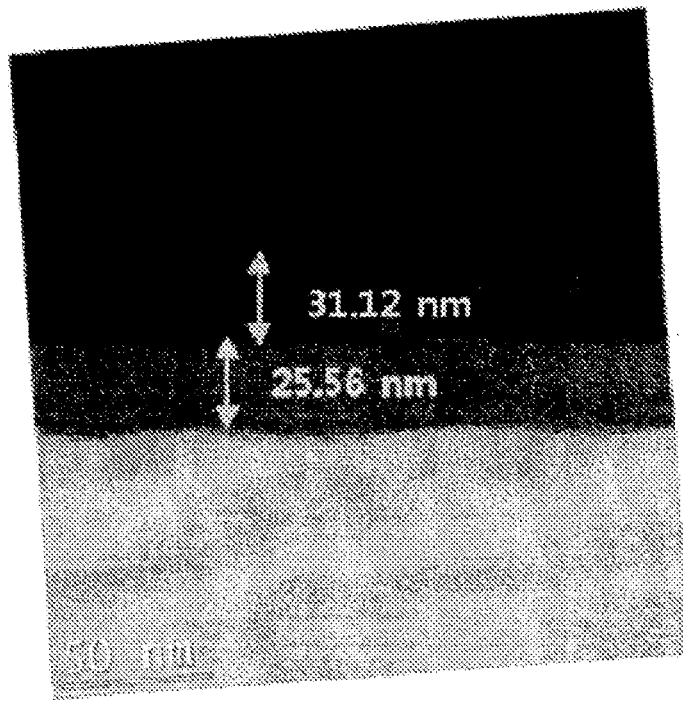
FIGS. 10A and 10B are micrographs of sections of diffusion layers of a display apparatus according to a comparative example under various conditions.
Figure 10B:
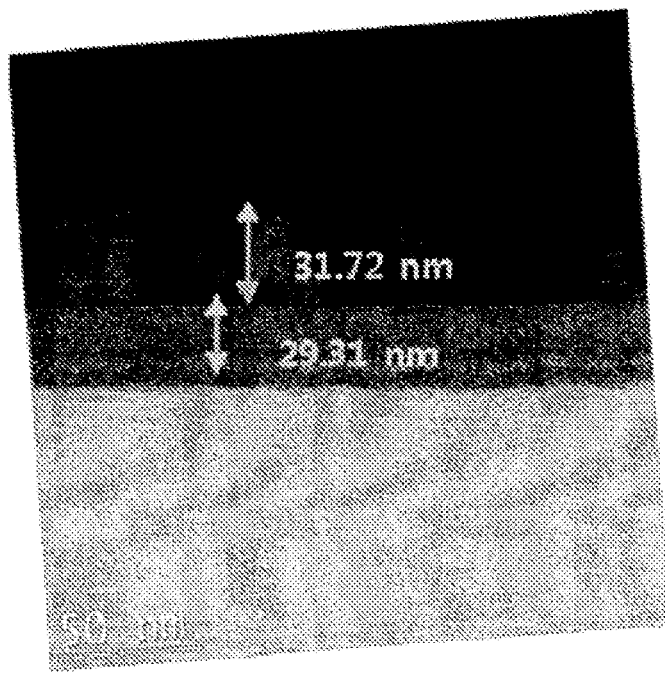

FIGS. 10A and 10B are micrographs of sections of diffusion layers of a display apparatus according to a comparative example under various conditions.

FIGS. 10A and 10B show cases where the first layer is formed by using a general-power sputtering scheme under mutually different conditions. Plasma having an electric power of 80 kW is used in the sputtering scheme.

According to FIG. 10A, the first thickness of the first layer was 31.12 nm, and the second thickness of the diffusion layer was 25.56 nm.

According to FIG. 10B, the first thickness of the first layer was 31.72 nm, and the second thickness of the diffusion layer was 29.31 nm.

Accordingly, it was found that plasma having an electric power of 40 kW or less can be used in the sputtering scheme. For example, plasma having an electric power of 30 kW is used in the sputtering scheme.

Figure 11:
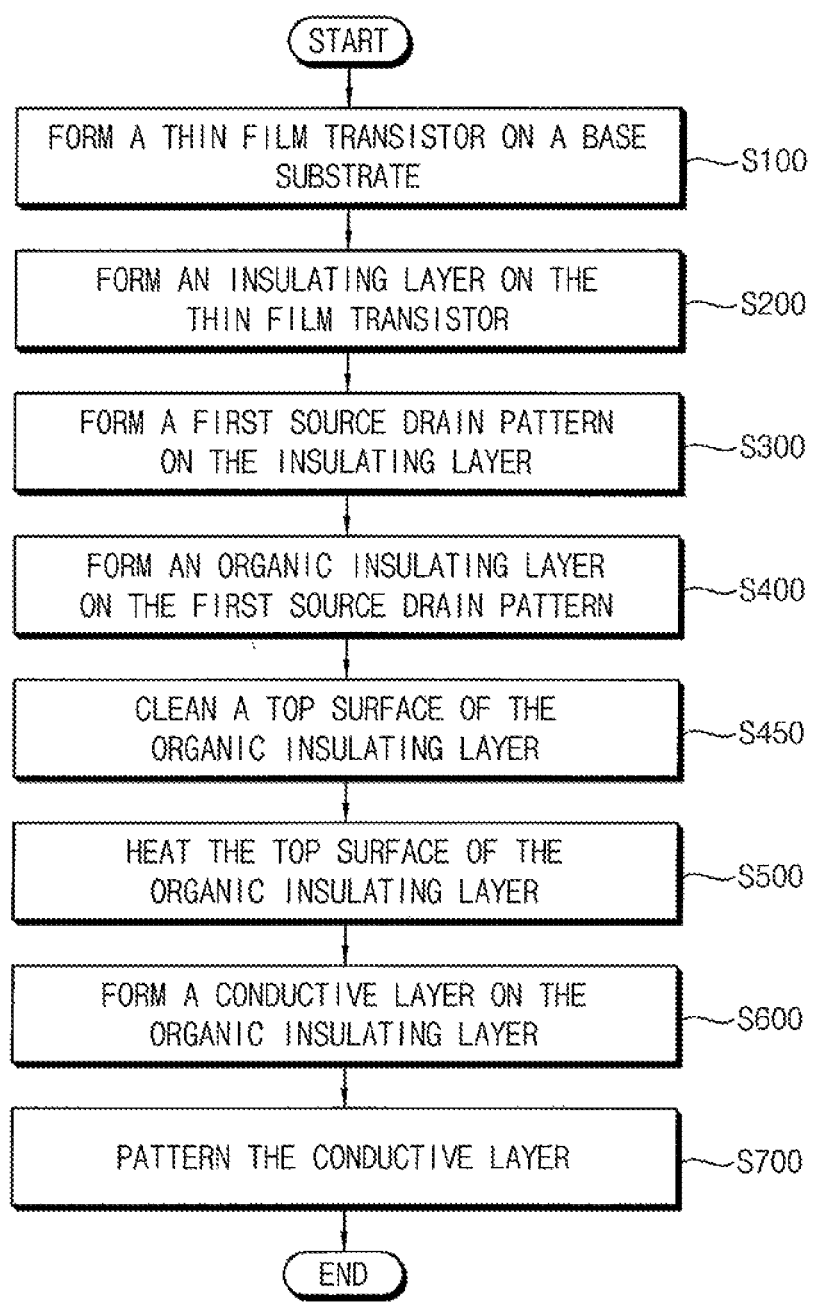
FIG. 11 is a flowchart of a method of manufacturing a display apparatus according to exemplary embodiments.

FIG. 11 is a flowchart of a method of manufacturing a display apparatus according to exemplary embodiments.

Referring to FIG. 11, a method according to an embodiment includes forming a thin film transistor on a base substrate (S100), forming an insulating layer on the thin film transistor (S200), forming a first source drain pattern on the insulating layer (S300), forming an organic insulating layer on the first source drain pattern (S400), heating a top surface of the organic insulating layer (S500), forming a conductive layer on the organic insulating layer (S600), and patterning the conductive layer (S700). A method of FIG. 11 further includes cleaning the top surface of the organic insulating layer (S450) by using a cleaning fluid before the top surface of the organic insulating layer is heated.

Since a method of FIG. 11 is substantially the same as a method described with reference to FIGS. 5A to 5I, duplicated description related thereto will be omitted.

FIG. 12 is a flowchart diagram illustrating a method of manufacturing a display apparatus according to exemplary embodiments.

Referring to FIG. 12, a method according to another embodiment includes forming a thin film transistor on a base substrate (S100), forming an insulating layer on the thin film transistor (S200), forming a first source drain pattern on the insulating layer (S300), forming an organic insulating layer on the first source drain pattern (S400), forming a conductive layer on the organic insulating layer by using low-power sputtering (S650), and patterning the conductive layer (S700).

According to an embodiment, when a conductive layer is formed on an organic insulating layer by a low-power sputtering (S650), the conductive layer is formed on the organic insulating layer by the sputtering scheme, where the conductive layer includes a first layer that has a first thickness and includes a first metal. In this case, a plasma having an electric power of 40 kW or less is used in the sputtering scheme.

A method of FIG. 12 is substantially the same as a method described with reference to FIG. 11 except that the first layer is formed by a low-power sputtering scheme instead of by heating the top surface of the organic insulating layer, so a detailed descriptions thereof will be omitted.

Figure 13:
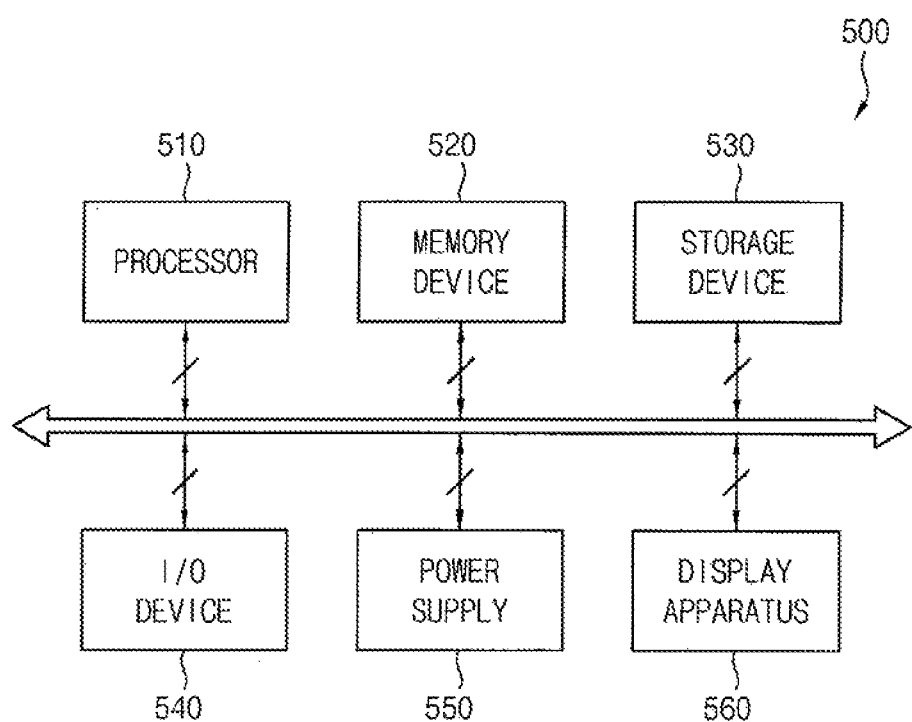
FIG. 13 is a block diagram of an electronic apparatus according to exemplary embodiments.
Figure 14A:
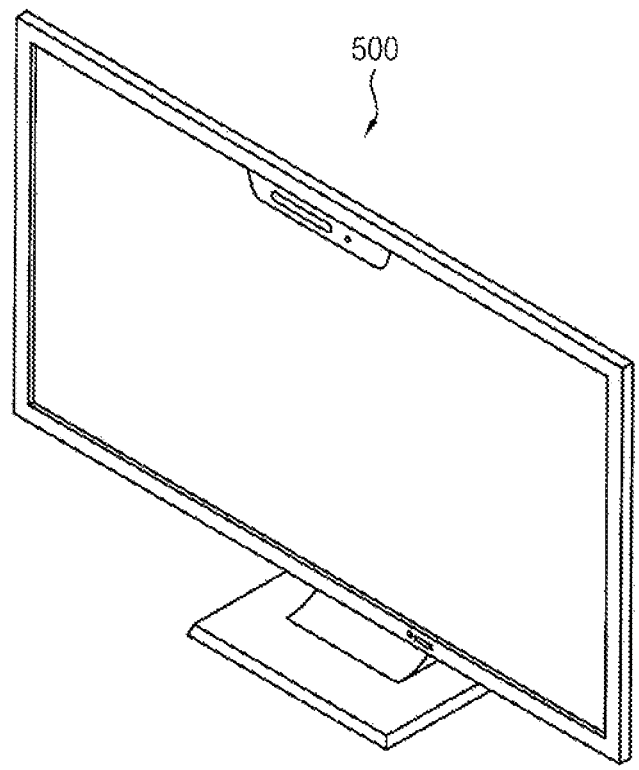
FIG. 14A illustrates an example in which an electronic apparatus of FIG. 13 is implemented as a television.
Figure 14B:
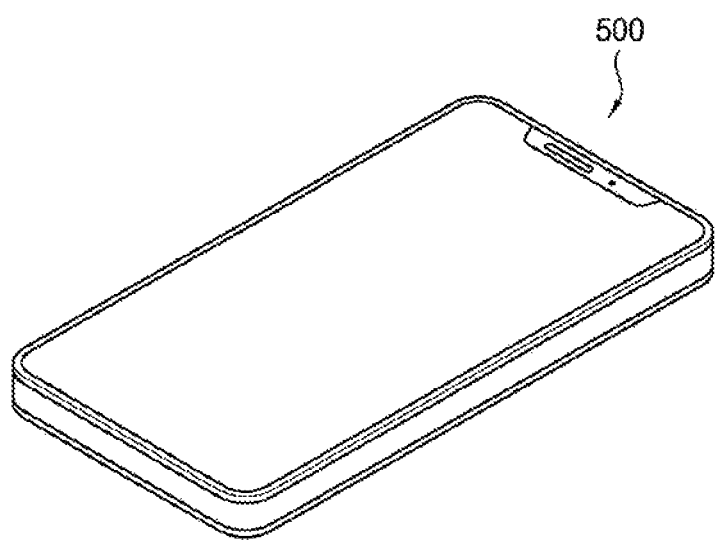
FIG. 14B illustrates an example in which an electronic apparatus of FIG. 13 is implemented as a smart phone.

FIG. 13 is a block diagram of an electronic apparatus according to exemplary embodiments, FIG. 14A illustrates an example in which an electronic apparatus of FIG. 13 is implemented as a television, and FIG. 14B illustrates an example in which an electronic apparatus of FIG. 13 is implemented as a smart phone.

Referring to FIGS. 13 to 14B, according to an embodiment, an electronic apparatus 500 includes a processor 510, a memory device 520, a storage device 530, an input/output (I/O) device 540, a power supply 550, and a display apparatus 560. Here, the display apparatus 560 is a display apparatus of FIG. 1. In addition, the electronic apparatus 500 further includes a plurality of ports for communicating with, respectively, a video card, a sound card, a memory card, a universal serial bus (USB) device, and other electronic apparatuses, etc. In an exemplary embodiment, as illustrated in FIG. 14A, the electronic apparatus 500 is a television. In another exemplary embodiment, as illustrated in FIG. 14B, the electronic apparatus 500 is a smart phone. However, embodiments of the electronic apparatus 500 are not limited thereto. For example, the electronic apparatus 500 may be a cellular phone, a video phone, a smart pad, a smart watch, a tablet PC, a car navigation system, a computer monitor, a laptop, or a head mounted display (HMD) apparatus, etc.

According to an embodiment, the processor 510 performs various computing functions. The processor 510 may be any one of a micro processor, a central processing unit (CPU), or an application processor (AP), etc. The processor 510 is coupled to other components via an address bus, a control bus, or a data bus, etc. Further, the processor 510 is coupled to an extended bus such as a peripheral component interconnection (PCI) bus. The memory device 520 stores data for operations of the electronic apparatus 500. For example, the memory device 520 includes at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, or a ferroelectric random access memory (FRAM) device, etc., or at least one volatile memory device such as a dynamic random access memory (DRAM) device, a static random access memory (SRAM) device, or a mobile DRAM device, etc. The storage device 530 is one or more of a solid state drive (SSD) device, a hard disk drive (HDD) device, or a CD-ROM device, etc. The I/O device 540 includes an input device such as a keyboard, a keypad, a mouse device, a touch-pad, a touch-screen, etc., and an output device such as a printer, a speaker, etc. The power supply 550 provides power for operations of the electronic apparatus 500.

According to an embodiment, the display apparatus 560 is coupled to other components via the buses or other communication links. In some exemplary embodiments, the I/O device 540 includes the display apparatus 560. As described above, the display apparatus 560 includes a base substrate, an organic insulating layer disposed on the base substrate, and a conductive pattern disposed on the organic insulating layer. Here, the conductive pattern includes a first layer that includes a first metal and that has a first thickness. In addition, a diffusion layer that makes contact with the first layer and that includes an oxide of the first metal and that has a second thickness less than the first thickness is formed at an uppermost portion of the organic insulating layer. Accordingly, defects can be prevented from forming in the conductive pattern disposed on the organic insulating layer.

Since these are described above, a duplicated description related thereto will be omitted.

Embodiments of the present inventive concept can be incorporated into a display apparatus and an electronic apparatus that includes the display apparatus. For example, embodiments of the present inventive concept can be incorporated into a smart phone, a cellular phone, a video phone, a smart pad, a smart watch, a tablet PC, a car navigation system, a television, a computer monitor, a laptop, or a head mounted display apparatus, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of embodiments of the present inventive concept. Accordingly, all such modifications are intended to be included within the scope of embodiments of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of manufacturing a display apparatus, the method comprising:
    forming a first organic insulating layer on a base substrate;
    heating a top surface of the first organic insulating layer;
    forming a conductive layer that includes a first layer that has a first thickness and that includes a first metal, on the first organic insulating layer; and
    forming a second conductive pattern by patterning the conductive layer,
    wherein a diffusion layer that makes contact with the first layer and that includes an oxide of the first metal and that has a second thickness less than the first thickness is formed at an uppermost portion of the first organic insulating layer, wherein the diffusion layer includes titanium, oxygen, and fluorine;
    wherein all portions of the first layer that are to be removed are removed by the patterning of the conductive layer, and
    a portion of the diffusion layer that does not overlap the second conductive pattern is not removed.

2. The method of claim 1, wherein the first layer is formed by a sputtering scheme when the conductive layer is formed.

3. The method of claim 1, further comprising:
    cleaning the top surface of the first organic insulating layer by using a cleaning fluid before heating the top surface of the first organic insulating layer.

4. The method of claim 3, wherein heating the top surface of the first organic insulating layer comprises heat-treating the top surface at a temperature between 60 degrees C. and 150 degrees C. for a time of at least 16 seconds.

5. The method of claim 1, further comprising:
    forming a first conductive pattern on the base substrate before forming the first organic insulating layer,
    wherein the first conductive pattern and the second conductive pattern at least partially overlap each other.

6. The method of claim 1, further comprising:
    forming a second organic insulating layer on the second conductive pattern; and
    forming a light emitting structure on the second organic insulating layer.

7. The method of claim 1, wherein the second conductive pattern includes the first layer, a second layer formed on the first layer, and a third layer formed on the second layer, wherein the first and third layers include titanium, and the second layer includes aluminum.

8. The method of claim 1, wherein the second thickness is equal to or less than 40% that of the first thickness.

9. The method of claim 1, wherein the first metal includes titanium.

10. The method of claim 1, wherein the first organic insulating layer includes a polyimide-based resin.

11. A method of manufacturing a display apparatus, the method comprising:
    forming a first organic insulating layer on a base substrate;
    forming a conductive layer that includes a first layer that has a first thickness and that includes a first metal on the first organic insulating layer by using a sputtering scheme; and
    forming a second conductive pattern by patterning the conductive layer,
    wherein a diffusion layer that makes contact with the first layer and that includes an oxide of the first metal and that has a second thickness less than the first thickness is formed at an uppermost portion of the first organic insulating layer, wherein the diffusion layer includes titanium, oxygen, and fluorine,
    wherein all portions of the first layer that are to be removed are removed by the patterning of the conductive layer, and
    a portion of the diffusion layer that does not overlap the second conductive pattern is not removed.

12. The method of claim 11, wherein a plasma having an electric power of 40 kW or less is used in the sputtering scheme.

* * * * *